(12) United States Patent
Iwashita

(10) Patent No.: US 7,911,466 B2
(45) Date of Patent: Mar. 22, 2011

(54) METHOD AND APPARATUS FOR EDITING TIMING DIAGRAM, AND COMPUTER PRODUCT

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 634 days.

(21) Appl. No.: 11/706,221

(22) Filed: Feb. 15, 2007

(65) Prior Publication Data

US 2008/0077896 A1    Mar. 27, 2008

(30) Foreign Application Priority Data

Sep. 26, 2006 (JP) ................................ 2006-260338

(51) Int. Cl.
*G09G 5/22* (2006.01)
*G06F 15/50* (2006.01)

(52) U.S. Cl. .............. 345/440.1; 716/6; 716/7; 345/440

(58) Field of Classification Search ............... 345/440.1, 345/440; 716/7, 6
See application file for complete search history.

(56) References Cited

U.S. PATENT DOCUMENTS

| | | | |
|---|---|---|---|
| 4,188,642 A * | 2/1980 | Morishita et al. ........... | 348/220.1 |
| 4,870,665 A * | 9/1989 | Vaughn ......................... | 327/114 |
| 5,293,628 A * | 3/1994 | Langan et al. ................. | 713/502 |
| 5,321,420 A * | 6/1994 | Rezek et al. ................. | 345/440.1 |
| 5,379,239 A * | 1/1995 | Nakatani ........................ | 708/206 |
| 5,469,544 A * | 11/1995 | Aatresh et al. ................. | 710/110 |
| 5,576,979 A * | 11/1996 | Lewis et al. ........................ | 716/6 |
| 5,745,386 A * | 4/1998 | Wile et al. ........................ | 703/15 |
| 5,790,435 A * | 8/1998 | Lewis et al. ........................ | 716/6 |
| 6,489,735 B2 * | 12/2002 | Ten Pierick et al. ........... | 315/371 |
| 6,717,992 B2 * | 4/2004 | Cowie et al. ................... | 375/316 |
| 6,745,376 B2 * | 6/2004 | Fredrickson ....................... | 716/6 |
| 6,963,373 B2 * | 11/2005 | Imaizumi ....................... | 348/312 |
| 7,013,430 B2 * | 3/2006 | Jaffe ............................... | 715/771 |
| 7,093,240 B1 * | 8/2006 | Rodi et al. ..................... | 717/139 |
| 7,133,738 B2 * | 11/2006 | Eichhorn et al. ............... | 700/181 |
| 7,194,713 B2 | 3/2007 | Iwashita | |
| 7,408,499 B2 * | 8/2008 | Szajnowski ..................... | 342/70 |
| 2004/0032412 A1 * | 2/2004 | Odom ........................... | 345/440 |
| 2006/0036983 A1 | 2/2006 | Iwashita | |

FOREIGN PATENT DOCUMENTS

| | | |
|---|---|---|
| JP | 63-075879 | 4/1988 |
| JP | 09-091338 | 4/1997 |
| JP | 2006-053813 | 2/2006 |

OTHER PUBLICATIONS

K. Ara and K. Suzuki, "A Proposal for Transaction-Level Verification with Component Wrapper Langugage", in 2003 IEEE/ACM Design Automation and Test in Europe Conference and Exposition, pp. 82-87, Mar. 2003.

(Continued)

*Primary Examiner* — M Good Johnson
(74) *Attorney, Agent, or Firm* — Staas & Halsey LLP

(57) ABSTRACT

A timing diagram is displayed on GUI of a timing diagram editing apparatus. Numerical information indicating the repetition number for which a waveform image within the arbitrary number of clocks is repeated is received, and the repetition number is determined based on the numerical information. A sequence image is displayed on GUI by replaying the waveform image with a continuous waveform image that is formed by repeating the waveform image for the determined repetition number of times.

16 Claims, 15 Drawing Sheets

OTHER PUBLICATIONS

F. Balarin and R. Passerone, "Functional Verification Methodology Based on Formal Interface Specification and Transactor Generation", in 2006 IEEE/ACM Design Automation and Test in Europe Conference and Exposition, pp. 1013-1018, Mar. 2006.

Japanese Office Action mailed Oct. 26, 2010 issued in respect to Japanese Application No. 2006-260338.

* cited by examiner

US 7,911,466 B2

METHOD AND APPARATUS FOR EDITING TIMING DIAGRAM, AND COMPUTER PRODUCT

CROSS-REFERENCE TO RELATED APPLICATIONS

This application is based upon and claims the benefit of priority from the prior Japanese Patent Application No. 2006-260338, filed on Sep. 26, 2006, the entire contents of which are incorporated herein by reference.

BACKGROUND OF THE INVENTION

1. Field of the Invention

The present invention relates to a technology of a timing diagram editing in logic verification of a hardware module, and more particularly, to a technology of mathematically describing an interface protocol of a hardware module.

2. Description of the Related Art

Usually, in specifications regarding a hardware module, an interface protocol is described by combining an overall description mainly in natural language and an illustration of typical examples by a timing diagram. A general-use word processor and a timing diagram editing tool are used for preparation of such kind of specification.

Recently, technologies are provided for automatically generating a verification environment in performing logic verification of a hardware module by inputting a mathematical protocol description (for example, K. Ara and K. Suzuki, "A Proposal for Transaction-Level Verification with Component Wrapper Language", in 2003 IEEE/ACM Design Automation and Test in Europe Conference and Exposition (DATE 2003), pp. 82-87, March 2003 or F. Balarin and R. Passerone, "Functional Verification Methodology Based on Formal Interface Specification and Transactor Generation", in 2006 IEEE/ACM Design Automation and Test in Europe Conference and Exposition (DATE 2006), pp. 1013-1018, March 2006). These technologies employ text-based protocol description language based on "regular expression" in the formal language theory.

A graphic user interface (GUI) is provided that enables a logic designer to describe any arbitrary logic using a general-purpose timing diagram (for example, Japanese Patent Publication No. 3271522). According to this technology, a test case regarding logic design can automatically be generated on the GUI.

However, the conventional technologies described above require a user to have a special skill of freely writing and reading mathematical protocol description to be used. This led to a problem that a design work is very difficult for the user having no such skill, resulting in a prolonged design period.

SUMMARY OF THE INVENTION

It is an object of the present invention to at least solve the above problems in the conventional technologies.

A computer-readable recording medium according to one aspect of the present invention stores therein a timing diagram editing program. The timing diagram editing program causes a computer to execute accepting numerical information representing repetition number of a waveform image appearing within an arbitrary number of clocks in a timing diagram displayed on a display screen; determining the repetition number of the waveform image based on the numerical information; and displaying a sequence image in which the waveform image is replaced with a continuous waveform image that is formed by repeating the waveform image for the determined repetition number of times so as to appear the repetition number of waveform images are connected.

A timing diagram editing apparatus according to another aspect of the present invention includes a receiving unit that receives numerical information representing repetition number of a waveform image appearing within an arbitrary number of clocks in a timing diagram displayed on a display screen; a determining unit that determines the repetition number of the waveform image based on the numerical information; and a display unit that displays a sequence image in which the waveform image is replaced with a continuous waveform image that is formed by repeating the waveform image for the determined repetition number of times so as to appear the repetition number of waveform images are connected.

A timing diagram editing method according to still another aspect of the present invention includes accepting numerical information representing repetition number of a waveform image appearing within an arbitrary number of clocks in a timing diagram displayed on a display screen; determining the repetition number of the waveform image based on the numerical information; and displaying a sequence image in which the waveform image is replaced with a continuous waveform image that is formed by repeating the waveform image for the determined repetition number of times so as to appear the repetition number of waveform images are connected.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiment of the present invention will be explained in detail with reference to accompanying drawings.

Figure 1:
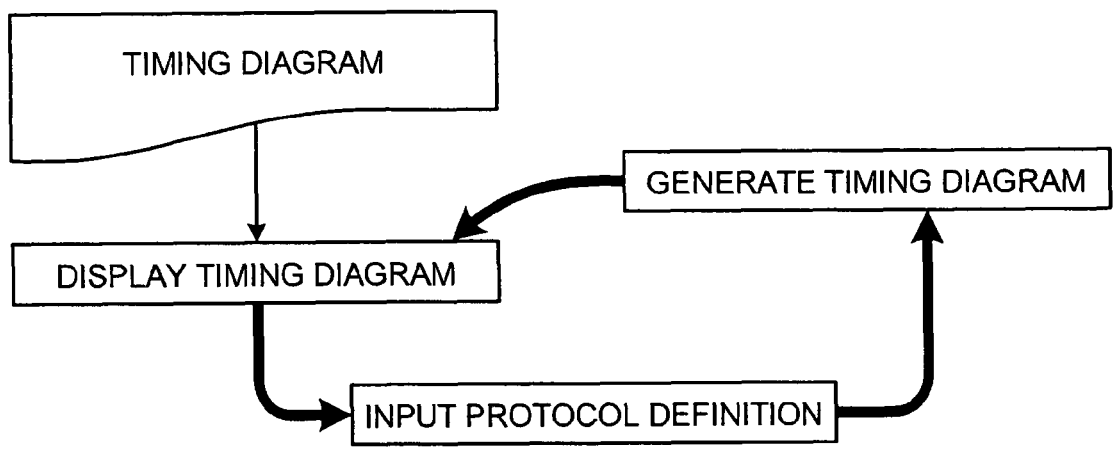
FIG. 1 is a schematic for explaining timing diagram editing processing according to embodiments of the present invention.

FIG. 1 is a schematic for explaining timing diagram editing processing according to embodiments of the present invention. The timing diagram editing processing shown in FIG. 1 is the processing to be executed in preparing an interface protocol regarding a hardware module. Firstly, a timing diagram is displayed on a GUI of a timing diagram editing apparatus 200 (see FIG. 2).

For example, it may be arranged such that the timing diagram is automatically drawn on the GUI from data input in a table format or a text format. It may also be so arranged that the timing diagram is prepared by directly editing on the GUI by a user.

The timing diagram is a diagram expressing in a time sequence the processing to be executed in an object to be designed and is an example of the sequence satisfying the interface protocol of the hardware module. Detailed description of the timing diagram will be made later.

Next, protocol definition by a mathematical expression is given to the timing diagram displayed on the GUI. For example, an expression having an expressing capability equivalent to that of the normal expression in the formal language theory is used as the mathematical expression. Basic operations of the normal expression are a connection, a selection and a repetition.

It is now assumed that X and Y are sequences expressed by the normal expression. For example, the normal expression XY expresses a sequence of appearance of X followed by Y. The normal expression X|Y expresses a sequence of appearance of either one of X and Y. The normal expression X* expresses a sequence of appearance of X 0 or more consecutive times. Furthermore, by combining these expressions, a variety of sequences can be expressed.

The connection specification, the selection specification and the repetition specification are hierarchically given to each sequence element shown in the timing diagram. The user gives the protocol definition to each sequence element by directly inputting the mathematical description to the timing diagram shown on the GUI.

As seen above, the interface protocol of the hardware module can efficiently be expressed by using the mathematical description having the same expressing capability as that of the normal expression. Description will later be made of inputting of the protocol definition to each sequence element.

When the inputting of the protocol definition is finished and a timing diagram generating button displayed on the GUI is depressed, a new timing diagram is generated according to the protocol definition, and the newly generated timing diagram is displayed on the GUI.

The user can intuitively confirm, through the new timing diagram displayed on the GUI, contents of the protocol definition. At this moment, when the protocol definition is judged to be insufficient, the user can make a change or addition to the protocol definition and can generate a further new timing diagram.

Since the timing diagram generated here is described in the mathematical expression that does not require a special expertise, understanding of the protocol definition by third parties can be facilitated. By inputting further protocol definition to a newly generated timing diagram, improvement can repeatedly be made between the timing diagram and the protocol definition and improved quality of the interface protocol can be achieved.

Figure 2:
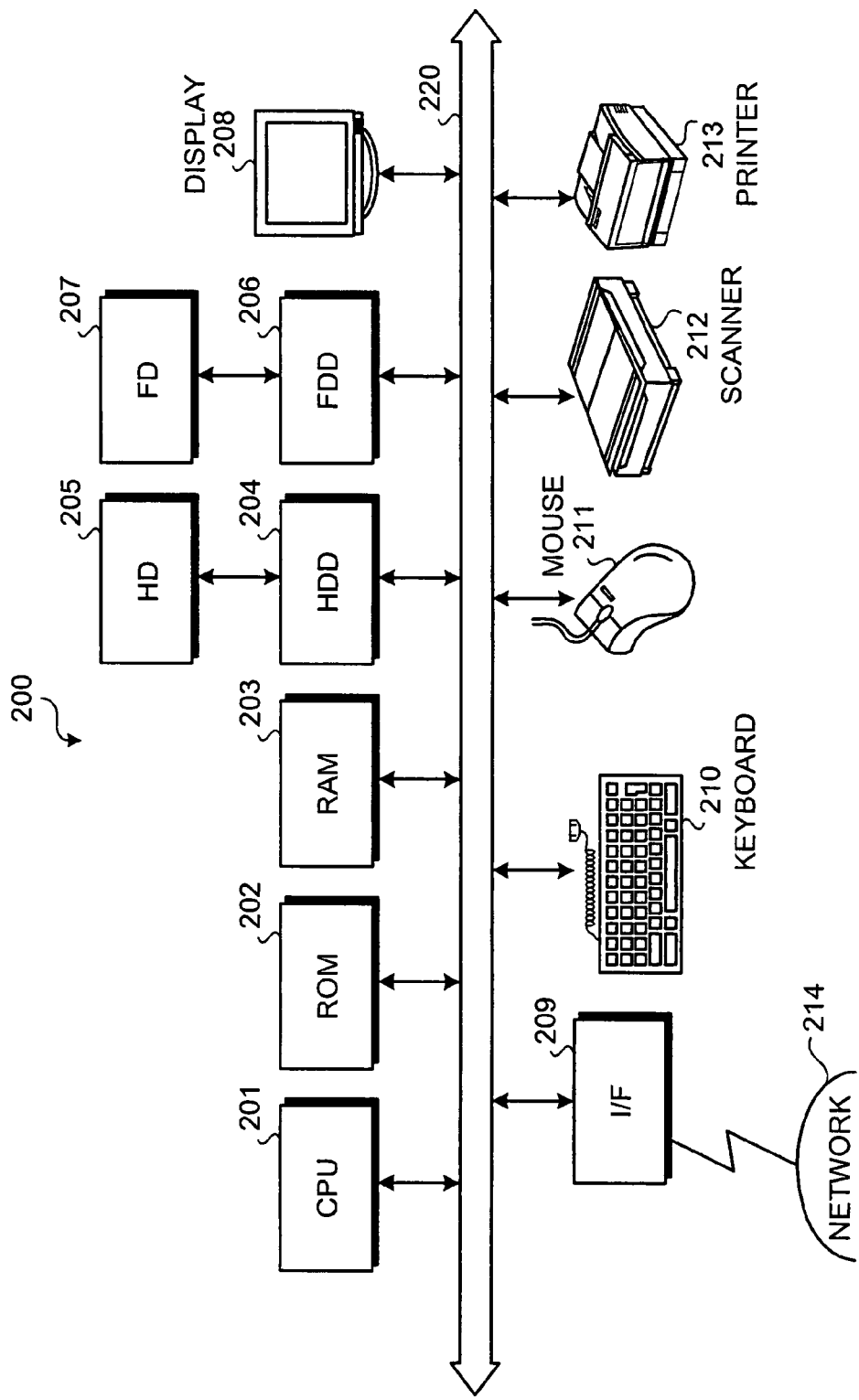
FIG. 2 is a schematic of a timing diagram editing apparatus according to the embodiments.

FIG. 2 is a schematic of the timing diagram editing apparatus 200. As shown in FIG. 2, the timing diagram editing apparatus 200 includes a central processing unit (CPU) 201, a read-only memory (ROM) 202, a random access memory (RAM) 203, a hard disk drive (HDD) 204, a hard disk (HD) 205, a flexible disk drive (FDD) 206, a flexible disk (FD) 207 as an example of a removal recording medium, a display 208, an interface (I/F) 209, a keyboard 210, a mouse 211, a scanner 212, and a printer 213. Component units are connected to one another by way of a bus 220.

The CPU 201 is in charge of overall control of the timing diagram editing apparatus 200. The ROM 202 stores programs such as a boot program. The RAM 203 is used as a work area of the CPU 201. The HDD 204 controls reading and writing of data from or to the HD 205 under control of the CPU 201. The HD 205 stores the data written under control of the HDD 204.

The FDD 206 controls reading and writing of data from or to the FD 207 under control of the CPU 201. The FD 207 stores the data written under control of the FDD 206 and has the data stored in the FD 207 read by the timing diagram editing apparatus 200.

A removal recording medium, besides the FD 207, may be a compact disc read-only memory (CD-ROM), compact disc recordable (CD-R), a compact disc rewritable (CD-RW), a magneto optical (MO) disk, a digital versatile disk (DVD), or a memory card. The display 208 displays a cursor, an icon, a tool box, and data such as document, image, and function information. The display 208 may be, for example, a cathode ray tube, a thin-film transistor liquid crystal display, or a plasma display.

The I/F 209 is connected to a network 214 such as Internet through a telecommunication line and is connected to other apparatuses by way of the network 214. The I/F 209 serves as an interface between the network 214 and the inside of the apparatus and controls the input and output of data from or to external apparatuses. The I/F 209 may be, for example, a modem or a local area network (LAN) adaptor.

The keyboard 210 is equipped with keys for input of characters, numerals, and various instructions, and data is entered through the keyboard 210. The keyboard 210 may be a touch-panel input pad or a numeric keypad. The mouse 211 performs a cursor movement, a range selection, a movement or size change of a window. The mouse 211 may be a trackball or a joystick if it has similar functions as a pointing device.

The scanner 212 optically reads an image and takes in the image data into the apparatus. The scanner 212 may have an OCR function as well. The printer 213 prints image data and document data. The printer 213 may be, for example, a laser printer or an ink jet printer.

Figure 3:
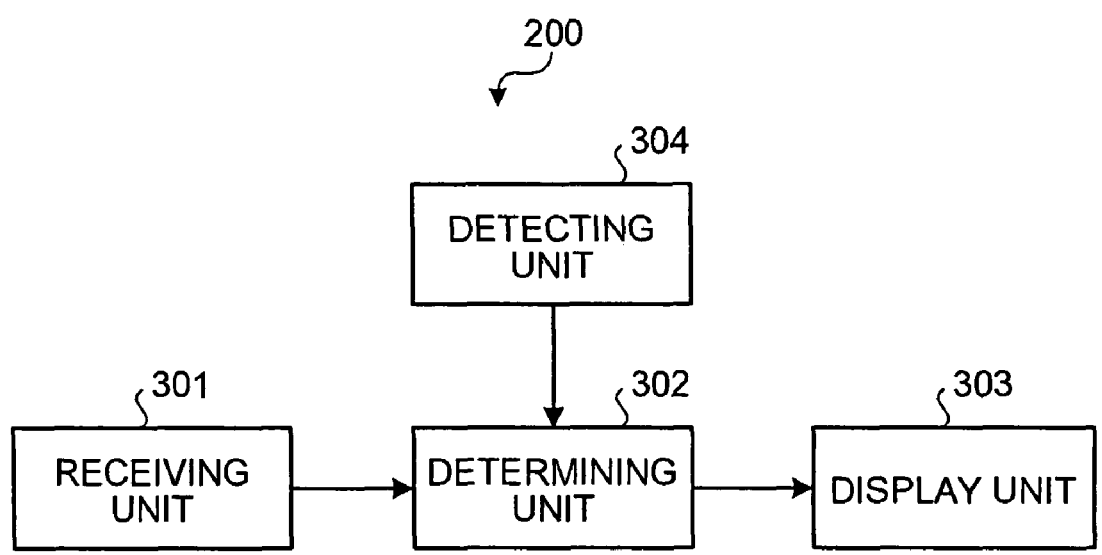
FIG. 3 is a block diagram of the timing diagram editing apparatus.

FIG. 3 is a block diagram of the timing diagram editing apparatus 200. As shown in FIG. 3, the timing diagram editing apparatus 200 includes a receiving unit 301, a determining unit 302, a display unit 303, and a detecting unit 304.

The receiving unit 301 receives numerical information indicative of the repetition number of a waveform image for an arbitrary number of clocks in the timing diagram displayed on the display screen. The waveform image for the arbitrary number of clocks indicates the waveform image appearing during the arbitrary number of clocks, in a sequence image shown in the timing diagram.

The repetition number indicates the number of times the waveform image is repeated when the waveform image for the arbitrary number of clocks is consecutively displayed. The numerical information expresses a pattern of the repetition number of the waveform image for the arbitrary number of clocks and is expressed in the mathematical expression having the same expressing capability as that of the normal expression.

For example, a specific integer value representing the repetition number of the waveform image may be input as the numerical information, or a plurality of integer values representing the repetition number of the waveform image may be input as the numerical information. Furthermore, a range of value that the repetition number of the waveform image can take may be input as the numerical information.

The determining unit 302 determines the repetition number of the waveform image, based on the numerical information input at the receiving unit 301. Specifically, when a plurality of specific integer values representing the repetition number of the waveform image are input as the numerical information, the determining unit 302 determines any one of the plurality of integer values as the repetition number of the waveform image.

When the range of value that the repetition number of the waveform image can take is input as he numerical information, the determining unit 302 may determine any one integer value out of the integer values within the range as the repetition number of the waveform image or may determine a boundary value or a typical value within the range of value that the repetition number of the waveform image can take as the repetition number of the waveform image.

The boundary value is a value serving as the boundary in the range of the value that the repetition number of the waveform image can take and, for example, when the range is "equal to or greater than one and equal to or smaller than three", the boundary value is one and three. The typical value is a representative value within the range of the value that the repetition number of the waveform image can take. The typical value may be directly input into the timing diagram editing apparatus 200 by the user based on description of the specification, etc., or it may be arranged such that the timing diagram editing apparatus 200 automatically reads out the typical value recorded beforehand on a recording medium such as the HD 205 or FD 207.

The display unit 303 displays a sequence image formed by replacing a waveform image of the timing diagram with the waveform image repeated for the determined repetition number to appear as a continuous waveform image. The continuous waveform image is a continuous image in which the waveform image for an arbitrary number of clocks is repeatedly displayed, and the number of times the waveform image is repeated is the repetition number determined by the determining unit 302. Specifically, the display unit 303 displays a sequence image formed by combining the waveform image other than the continuous waveform image out of the timing diagram with the continuous waveform image.

The sequence image is a waveform image representing a sequence of operation when a waveform image out of the timing diagram is replaced by the continuous waveform image. Specifically, by displaying, in place of the waveform image for an arbitrary number of clocks in the timing diagram, the waveform image connected for the repetition number to form a continuous waveform image, a new timing diagram is displayed.

The detecting unit 304 detects a display instruction of either an example sequence image or counterexample sequence image of the timing diagram. The example sequence image is a sequence image that can be expressed using the repetition number of the waveform image expressed in the numerical information. The counterexample sequence image is a sequence image that can be expressed using the repetition number of the waveform image not expressed in the numerical information.

It may be so arranged that the user inputs the display instruction of either the example sequence image or the counterexample sequence image by operating the keyboard 210 or the mouse 211. For example, the display instruction can be given by pointing a cursor to and clicking on an examples button or a counterexamples button displayed on the display 208.

It may be so arranged that the determining unit 302 determines the repetition number of the waveform image based on the result of detection by the detection unit 304. Specifically, when the detecting unit 304 detects the input of the display instruction of the example sequence image, the determining unit 302 determines the repetition number of the waveform image out of the numbers of repetition number of the waveform image expressed by the numerical information. In this case, the display unit 303 displays the example sequence image as the sequence image.

When the detecting unit 304 detects the input of the display instruction of the counterexample sequence image, the determining unit 302 determines the repetition number of the waveform image out of the numbers of repetition number of the waveform image not expressed by the numerical information. In this case, the display unit 303 displays the counterexample sequence image as the sequence image.

The display unit 303 displays an area in which a designation of a waveform image is displayed, corresponding to the waveform image. The designation of the waveform image is arbitrarily describable by the user and is, for example, a keyword, etc., representing a sequence of operation expressed by the waveform image. Size and display position of the area in which to describe the designation can arbitrarily be set.

The display unit 303 displays the area with its size varied depending on the repetition number of the waveform image determined by the determining unit 302. For example, when the repetition number is "3", the area is displayed with its size extended by three times in the direction of progress of the waveform.

Figure 4:
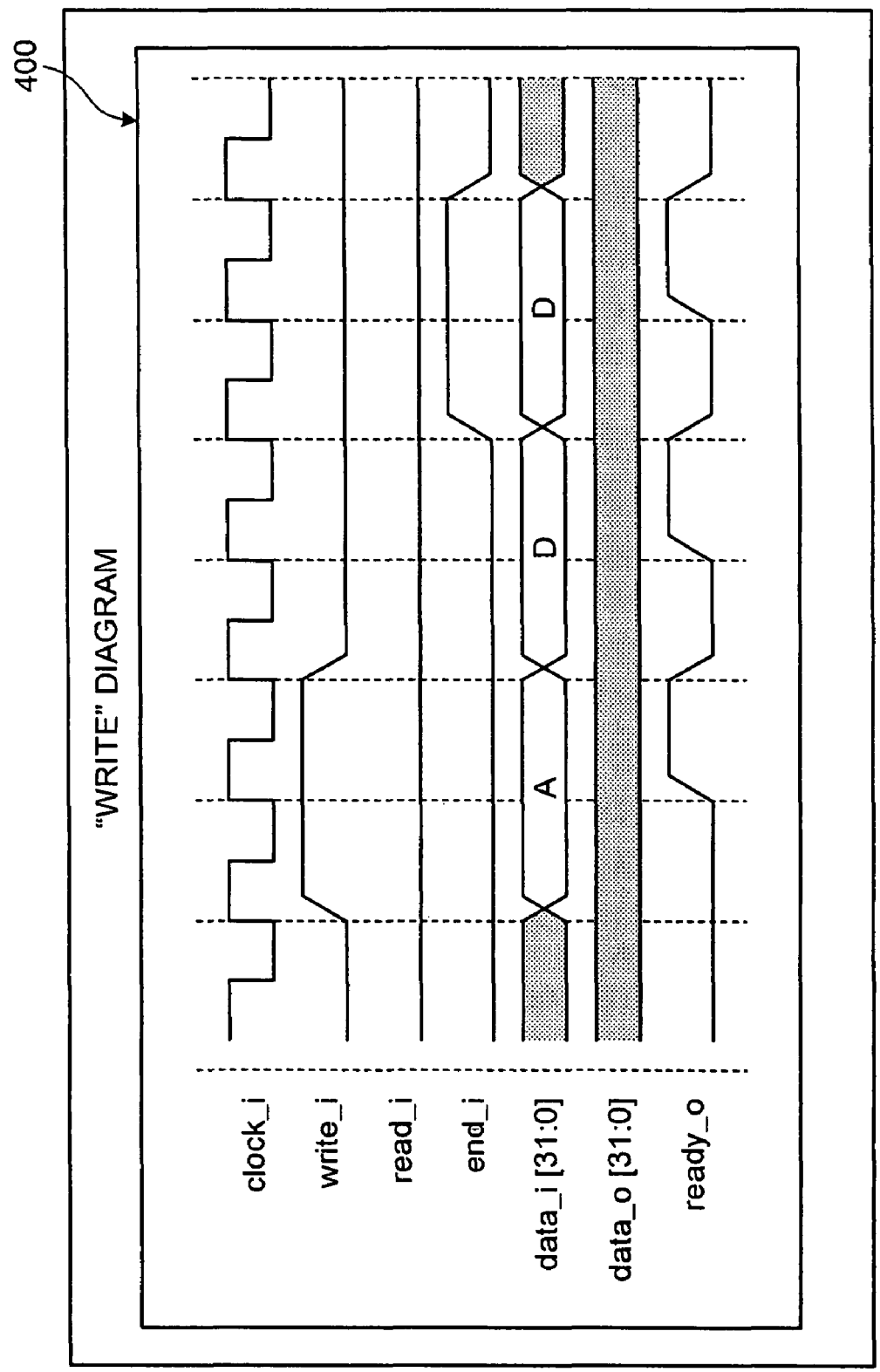
FIG. 4 is a schematic illustrating an example of a timing diagram corresponding to a WRITE sequence.

FIG. 4 is schematic illustrating an example of the timing diagram corresponding to a WRITE sequence. The timing diagram 400 shown in FIG. 4 indicates a value of a signal for each clock cycle with respect to each sequence.

A clock_i in the timing diagram 400 is a clock input signal of the hardware module, and this hardware module additionally has input signals of write_i, read_i, end_i, and data_i [31:0] and output signals of data_o[31:0] and ready_o.

In the WRITE sequence shown in the timing diagram 400, first, the write signal is input together with address data and the ready_o signal as a response signal is awaited. Then, when the response signal (ready_o signal) comes, the state moves to the next one and one piece of data is transmitted. When the transmission of one piece of data is finished and the ready_o signal as the response signal comes, next piece of data is transmitted and the response signal is awaited.

By inputting the protocol definition to this basic-form timing diagram 400, various timing diagrams are prepared that satisfy the interface protocol of the hardware module.

Figure 5:
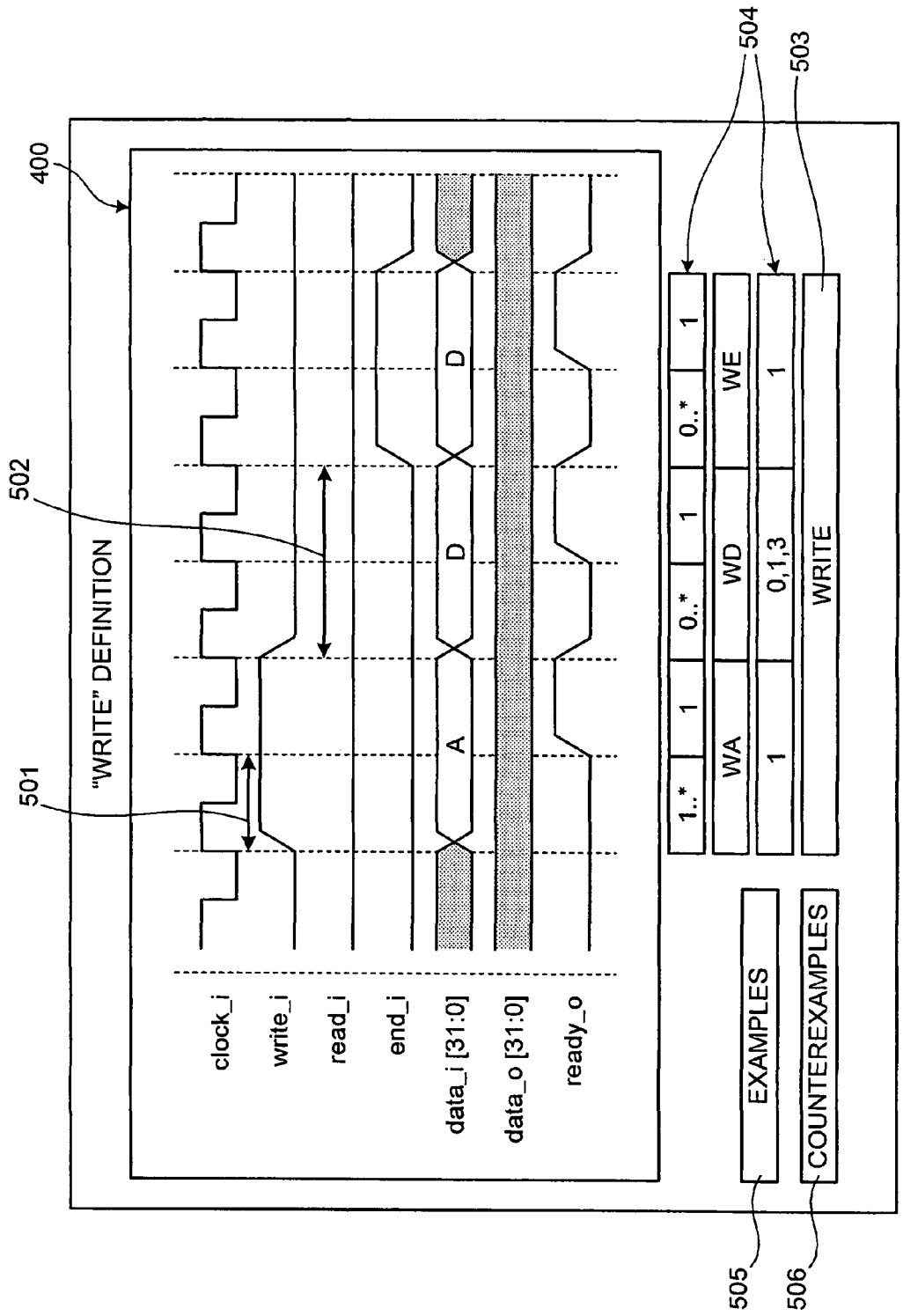
FIG. 5 is schematic illustrating an example of protocol definition corresponding to the WRITE sequence.

FIG. 5 is an explanatory diagram of an example of the protocol definition corresponding to the WRITE sequence. The protocol definition is of a hierarchical structure with each cycle of the timing diagram 400 as the lowest layer. The user executes the protocol definition by inputting numerical information representing the repetition number of a sequence element of an arbitrary number of cycles (the waveform image for an arbitrary number of clocks) out of the timing diagram 400.

The user can arbitrarily describe a designation for the sequence element composed of at least one cycles. In the example shown in FIG. 5, an area for describing the designation (e.g., area 503) is displayed at the lower part of the timing diagram 400. The size of the area for describing the designation is correlated with the size of the waveform image of each sequence element.

Specifically, the designation of WA is described for the sequence element composed of the second and third cycles of the timing diagram 400, the designation of WD for the sequence element composed of the fourth and fifth cycles, the designation of WE for the sequence element composed of the sixth and seventh cycles, and the designation of WRITE for the sequence element composed of the second to seventh cycles, in the area of the size correlated with the size of the waveform of each sequence element.

Namely, sequence elements at the lowest layer of the timing diagram 400 are connected to make up the sequence elements WA, WD and WE, and furthermore, lower sequence elements WA, WD, and WE are connected to make up an upper-layer sequence element WRITE.

When the user describes the designation of each sequence element, the designation of each sequence can be described by firstly specifying an arbitrary area out of the areas displayed at the lower part of the timing diagram 400 and then inputting an arbitrary keyword within thus specified area.

Then, the protocol definition is input for each sequence element. Specifically, the numerical value representing the repetition number of each sequence element is input within a cell 504 provided at the lower part of the timing diagram 400. For example, when a simple integer value "n" is input as the numerical information, this means that the corresponding sequence element is repeated n times. When "n..m" is input as the numerical information, this means that the corresponding sequence element is repeated within a range of more than or equal to n times and less than or equal to m times.

When "n..*" is input as the numerical information, this means that the corresponding sequence element may be repeated without upper limit if more than or equal to n times. When "n..m" is input as the numerical information, this means the selection of n times or m-times repetition of a lower sequence element, in other words, selection of n-times repetition or m-times repetition of the lower sequence element.

Specifically, for example, "1..*" is input as the numerical information representing the repetition number of a sequence element 501 (corresponding to a leading cycle of WA). This indicates that the sequence element 501 may be repeated without upper limit if more than or equal to one time.

"0, 1, 3" is input as the numerical information representing the repetition number of a sequence element 502 (corresponding to WD). This indicates that the repeating of the sequence element 502 is selected out of zero-times repetition, one-time repetition, and three-times repetition.

As seen above, the protocol definition is given to the timing diagram 400 by inputting in mathematical description the numerical information representing the repetition number to an arbitrary sequence element. As a result, the connection specification, selection specification, and repetition specification to various sequence elements can hierarchically be given.

Selection of an examples button 505 or a counterexamples button 506 displayed at the lower part of the timing diagram 400 can automatically prepare the example sequence or counterexample sequence of the hardware module based on the input protocol definition. For example, by operating the mouse 211 to point a mouse cursor to and click on the Examples button or the Counterexamples button, the user can select either one of these sequences.

Firstly, the selection specification or the repetition specification to the sequence element is extracted out of the protocol definition shown in FIG. 5. Namely, the selection specification or repetition specification excluding the one in which one simple integer value is input as the numerical information is extracted out of the protocol definition.

Applicable in FIG. 5 are the selection specification "0, 1, 3" representing the repetition number of the WD, repetition specification "1..*" representing the repetition number of the leading cycle of the WA, the repetition specification "0..*" representing the repetition number of the leading cycle of the WD, and the repetition specification "0..*" representing the repetition number of the leading cycle of the WE. These four items are referred to as $C_1$, $C_2$, $C_3$, and $C_4$, respectively.

Figure 6:
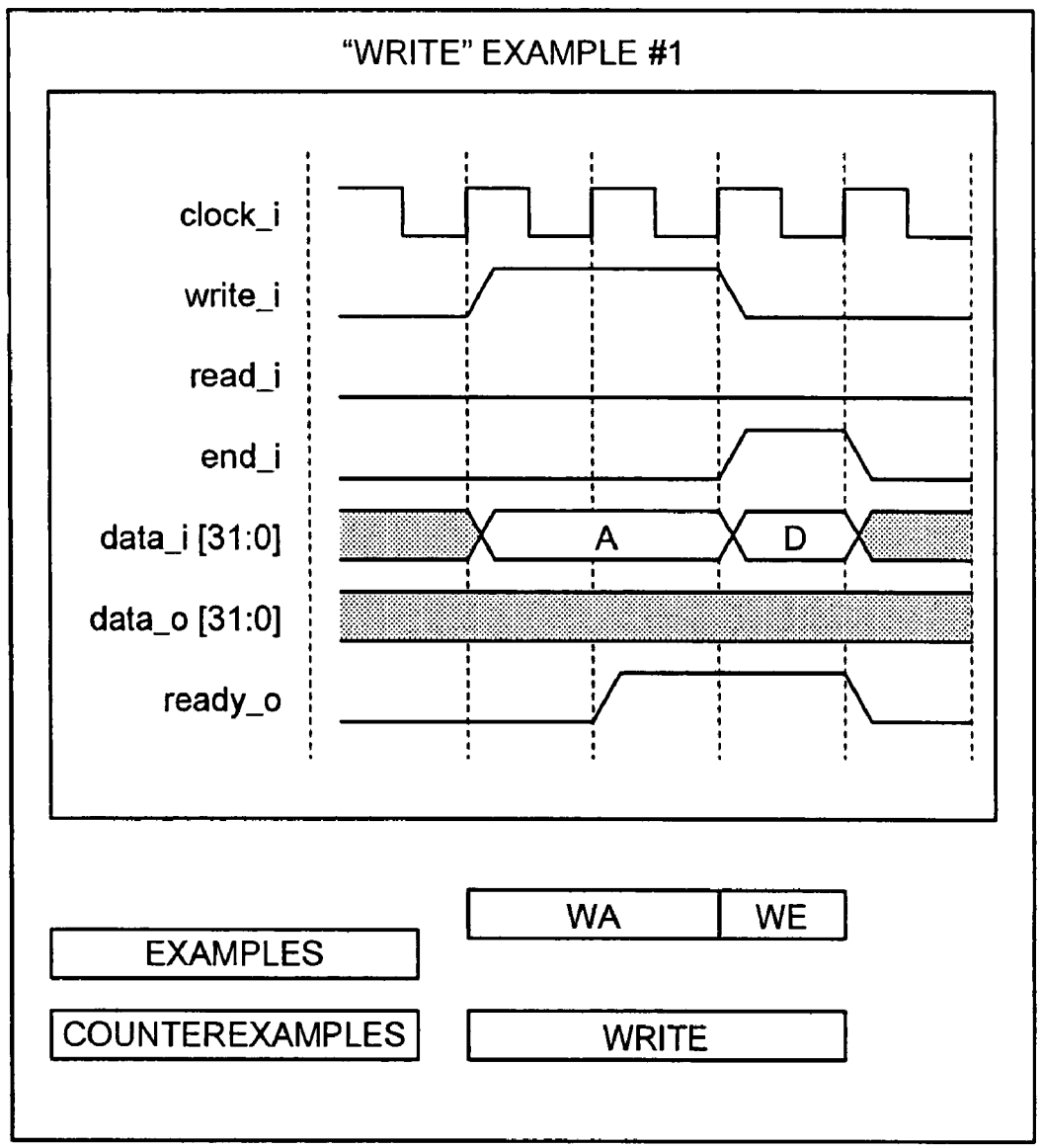
FIG. 6 is an explanatory diagram of an example sequence.
Figure 7:
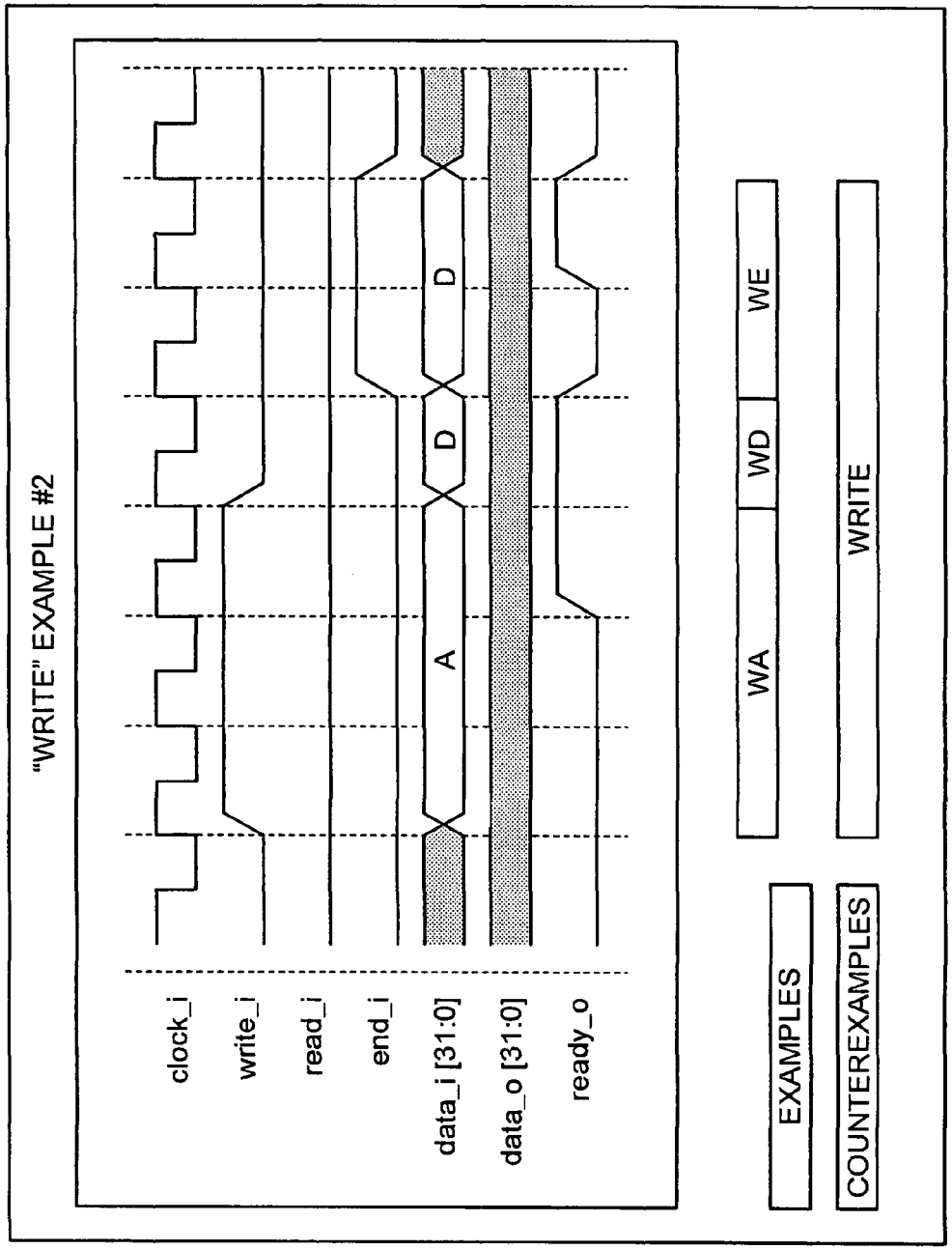
FIG. 7 is an explanatory diagram of another example sequence.
Figure 8:
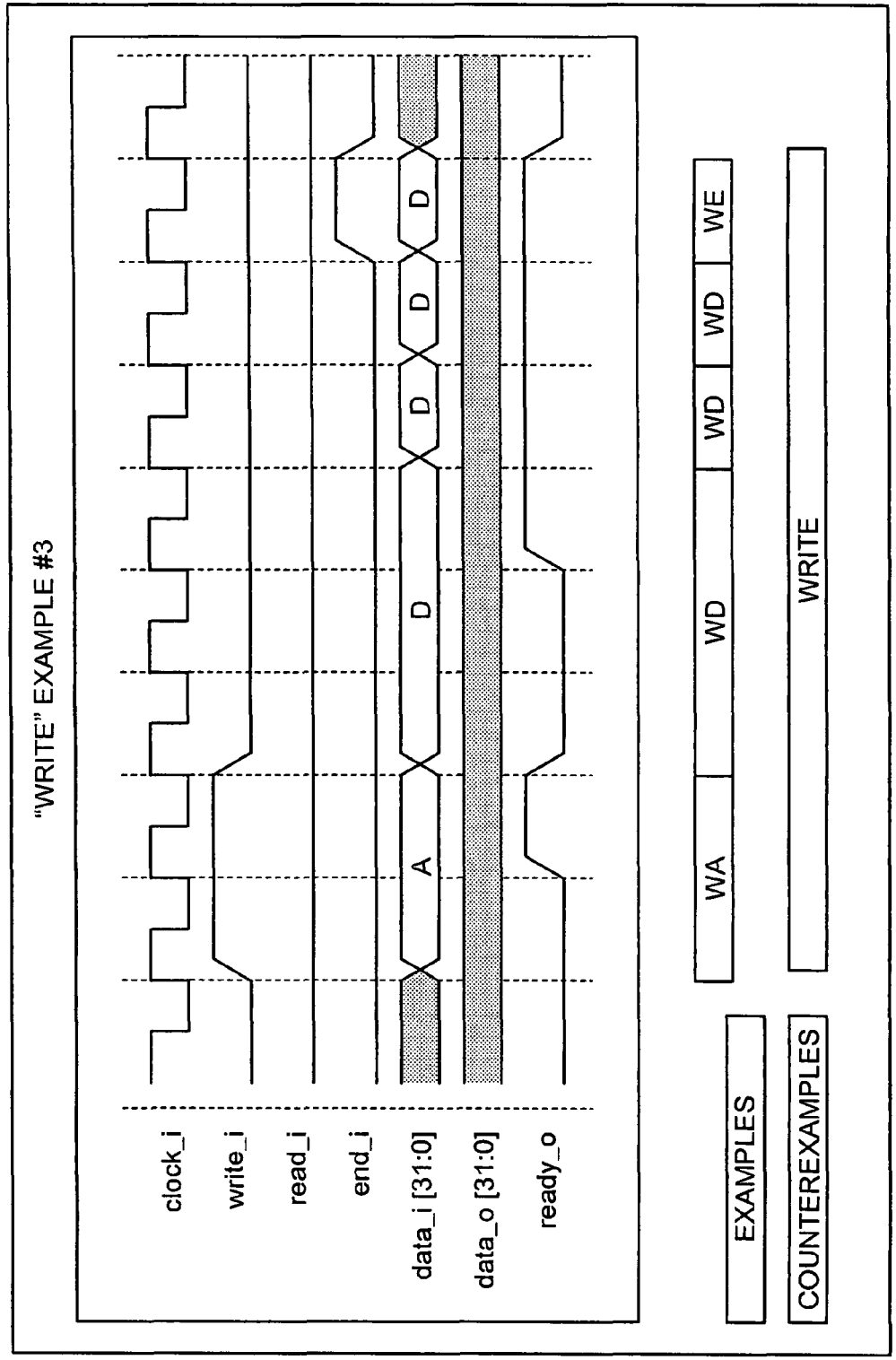
FIG. 8 is an explanatory diagram of still another example sequence.

Each of FIGS. 6 to 8 is an explanatory diagram of a specific example of the example sequence. In this case, with respect to the selection specification, the example sequence is generated using an integer value corresponding to each choice.

With respect to the repetition specification, the example sequence is generated using a boundary value of the repetition number and a typical value selected at random other than the boundary value. Combinations of items are not taken into consideration, and the example sequences are generated so that each case is selected one or more times.

In FIGS. 6 to 8, $C_1$ has three cases of zero times, one time and three times ($C_{10}$, $C_{12}$, and $C_{13}$, respectively), $C_2$ has the case of one time and the case of 2 or more times ($C_{21}$ and $C_{22+}$, respectively), and $C_3$ and $C_4$ have the case of zero times and the case of 1 or more times ($C_{30}$ and $C_{31+}$, respectively and $C_{40}$ and $C_{41+}$, respectively).

The example sequence is generated with respect to all of the above cases. Namely, until all cases are selected with respect to each item of $C_1$ to $C_4$, the generation of the example sequence is repeated. In such selection, a case not yet selected has a priority and a case is selected at random from the item with respect to which all cases have already been selected.

In FIG. 6, cases $C_{10}$, $C_{21}$, and $C_{40}$ are selected out of the above cases and the corresponding example sequence is generated. Specifically, since the case $C_{10}$ is selected, the repetition number of the WD becomes "0" and the waveform image corresponding to the WD is deleted.

Since the case $C_{21}$ is selected, the repetition number of the leading cycle of the WA becomes "1" and the same waveform image as the original one is displayed. Since the case $C_{40}$ is selected, the repetition number of the leading cycle of the WE becomes "0" and the waveform image corresponding to the leading cycle of the WE is deleted. Since $C_{10}$ is selected, selection can not be made from the item $C_3$.

In FIG. 7, cases $C_{11}$, $C_{22+}$, $C_{30}$ and $C_{41+}$ are selected out of the above cases and the corresponding example sequence is generated. Since $C_{11}$ is selected this time, one case is selected out of the item $C_3$.

In FIG. 8, cases $C_{13}$, $C_{21}$, $C_{31+}$, $C_{30}$, and $C_{40}$ are selected and the corresponding example sequence is generated. Since $C_{13}$ is selected, three cases are selected out of the item $C_3$.

In the specific examples described in FIGS. 6 to 8, the example sequences are generated in such a manner that each case is selected one or more times, without taking into consideration the combinations of the items. However, it may be so arranged that combinations of the items are taken into consideration and more example sequences are generated.

The example sequence may be generated by selecting some cases at random rather than covering all cases or by selecting only noteworthy cases based on preset conditions.

Each of FIGS. 9 to 13 is an explanatory diagram of a specific example of the counterexample sequence. In these diagrams, a location at which the protocol definition is violated is indicated by "x" and a sequence that is not materialized because of the violation is indicated by "~" placed before the designation thereof. Since the specific flow of processing in the case of generating the counterexample sequence is almost the same as that in the case of generating the example sequence, the description thereof is omitted.

With respect to the selection specification for the repetition number, the counterexample sequence is generated employing as the repetition number the number of times one time more or one time less than a case included in choices as a representative example. With respect to the range specification for the repetition specification, the counterexample sequence is generated employing as the repetition number the number of times one time more or one time less than the range of value that the repetition number can take.

Furthermore, it is so arranged that a counterexample case (the repetition number not expressed in the numerical information) appears only at one location out of one counterexample sequence. This arrangement can limit the counterexample sequence that exists infinitely.

Figure 9:
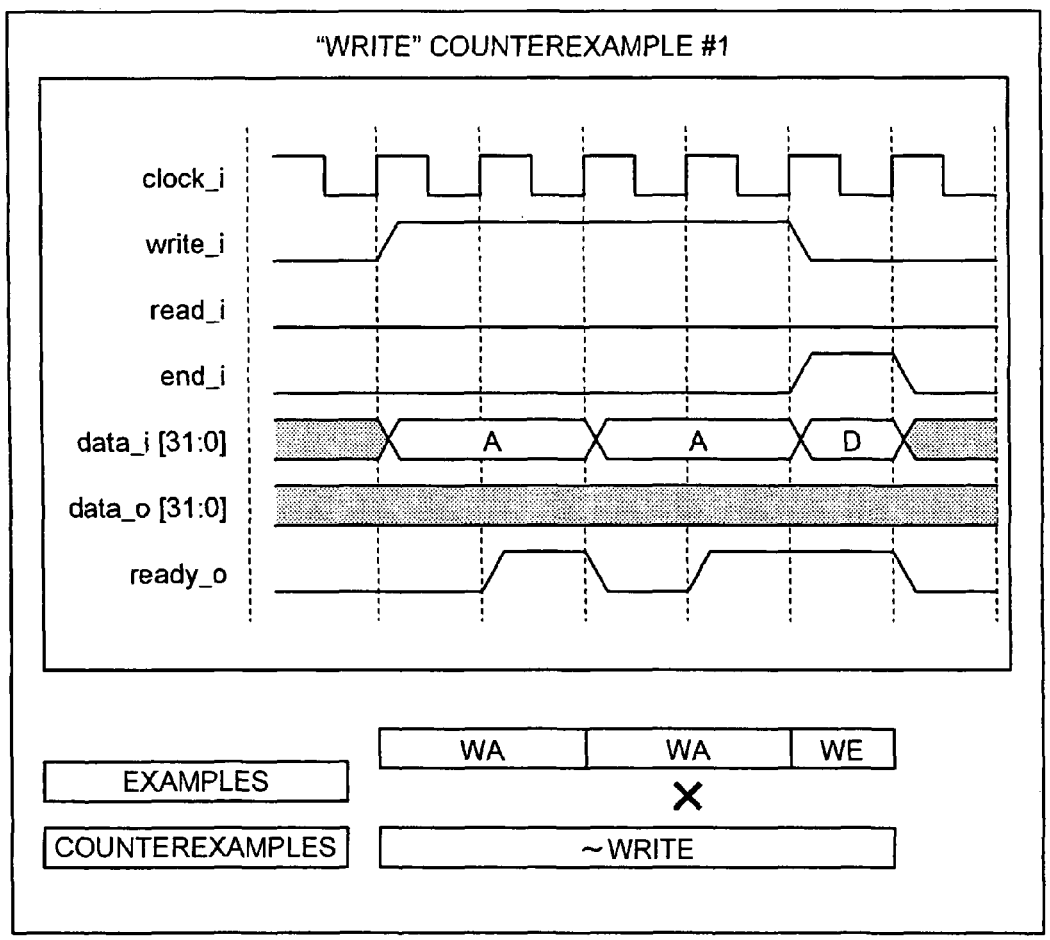
FIG. 9 is an explanatory diagram of a counterexample sequence.

In FIG. 9, the counterexample case is that the repetition number of the WA is "2". Namely, although the repetition number of "2" can not be selected because the repetition number of the WA is specified as "1", the WA is repeated two times. As a result, the "x" is indicated at the location of the second WA that violates the protocol definition and the "~" is indicated before the designation of the WRITE sequence that is not materialized because of the violation.

Figure 10:
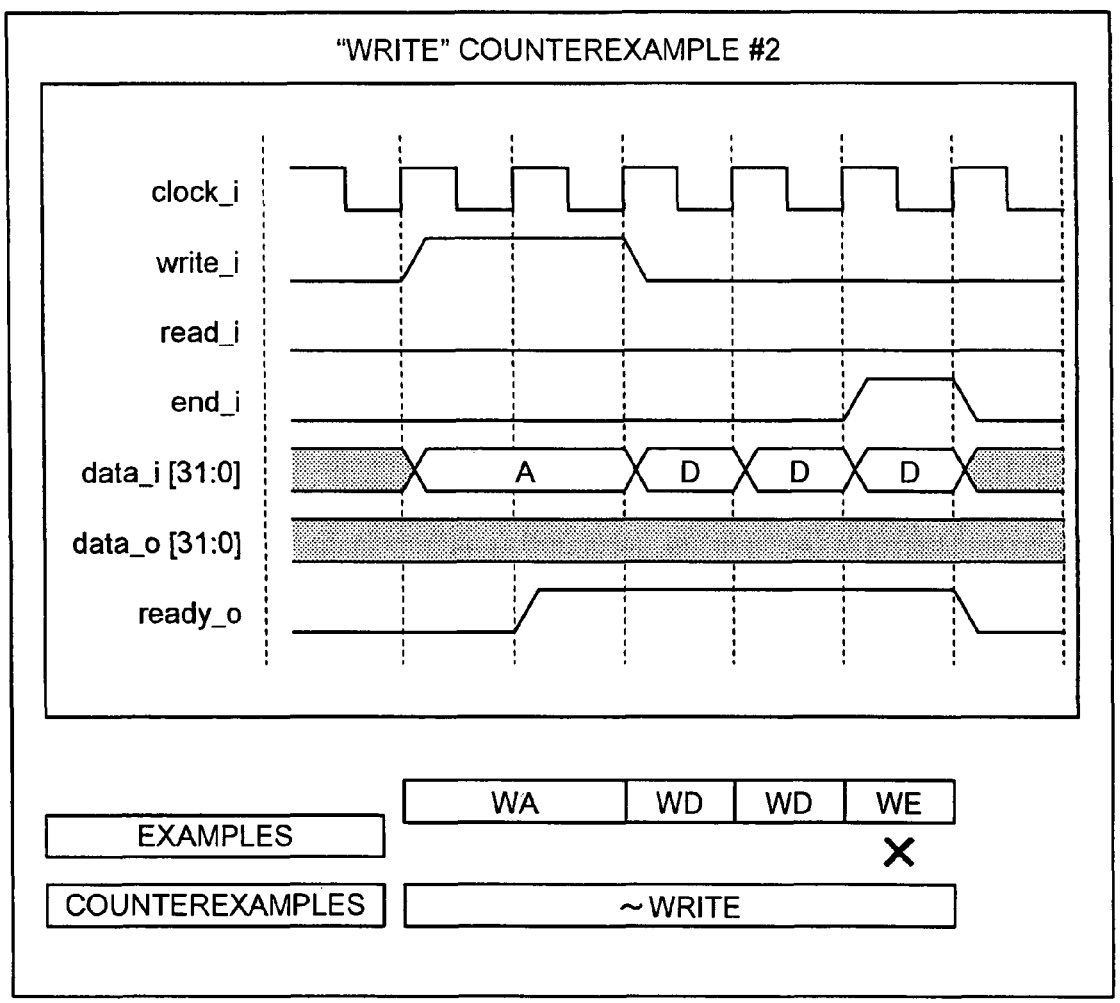
FIG. 10 is an explanatory diagram of another counterexample sequence.

In FIG. 10, the counterexample case is that the repetition number of the WD is "2". Namely, since the repetition number of the WD is specified as "0, 1, 3", the "2" can not be selected. However, after the WD is repeated two times, the WE is repeated one time rather than the WD is repeated one more time. As a result, the "x" is indicated at the location of the WE (that should correctly be the WD) at which the protocol definition is violated and the "~" is indicated before the designation of the WRITE sequence that is not materialized because of the violation.

Figure 11:
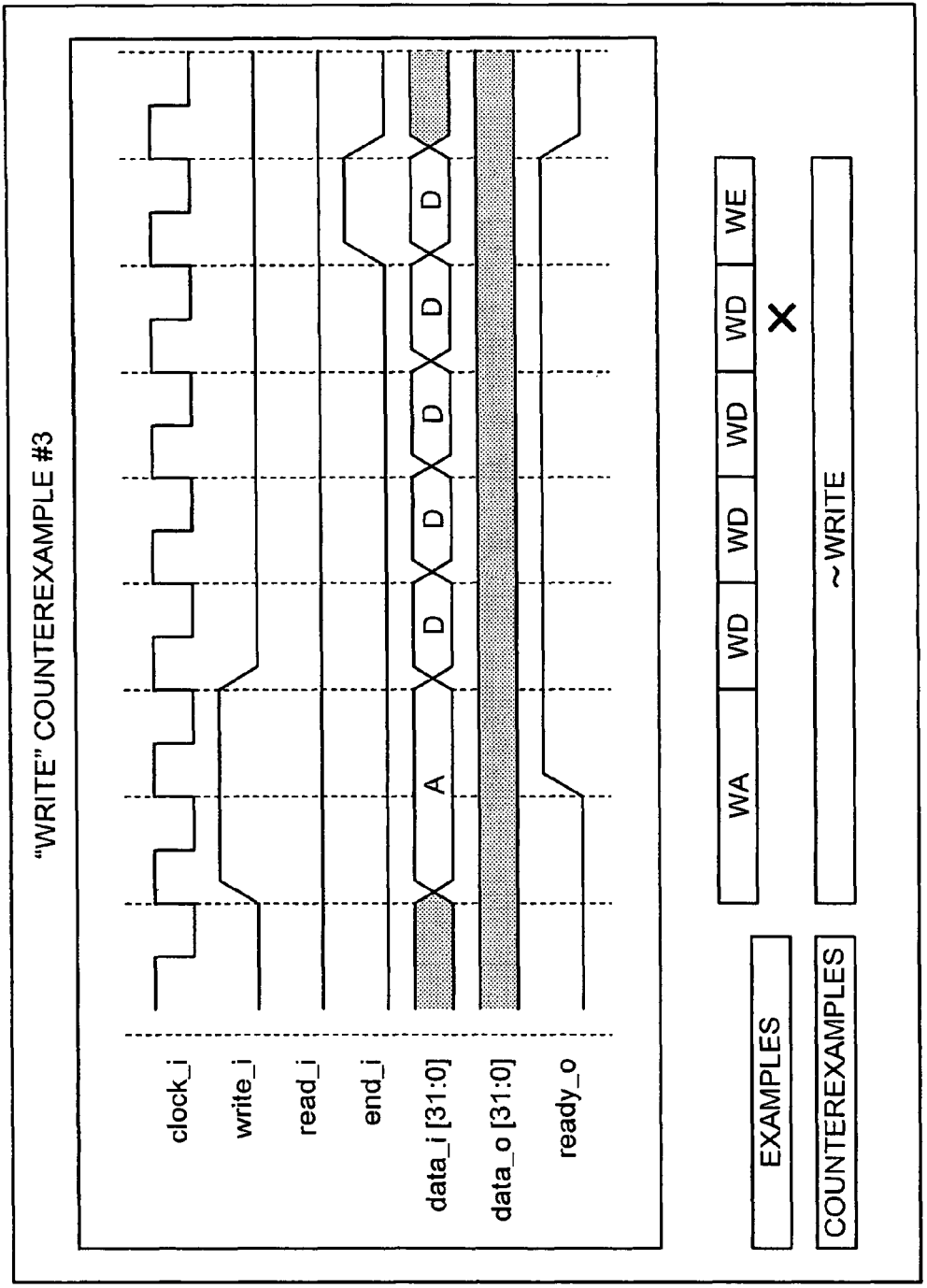
FIG. 11 is an explanatory diagram of still another counterexample sequence.

In FIG. 11, the counterexample case is that the repetition number of the WD is "4". Namely, although the repetition number of "4" can not be selected because the repetition number of the WD is specified as "0, 1, 3", the WD is repeated four times. As a result, the "x" is indicated at the location of the fourth WD at which the protocol definition is violated and the "~" is indicated before the designation of the WRITE sequence that is not materialized because of the violation.

Figure 12:
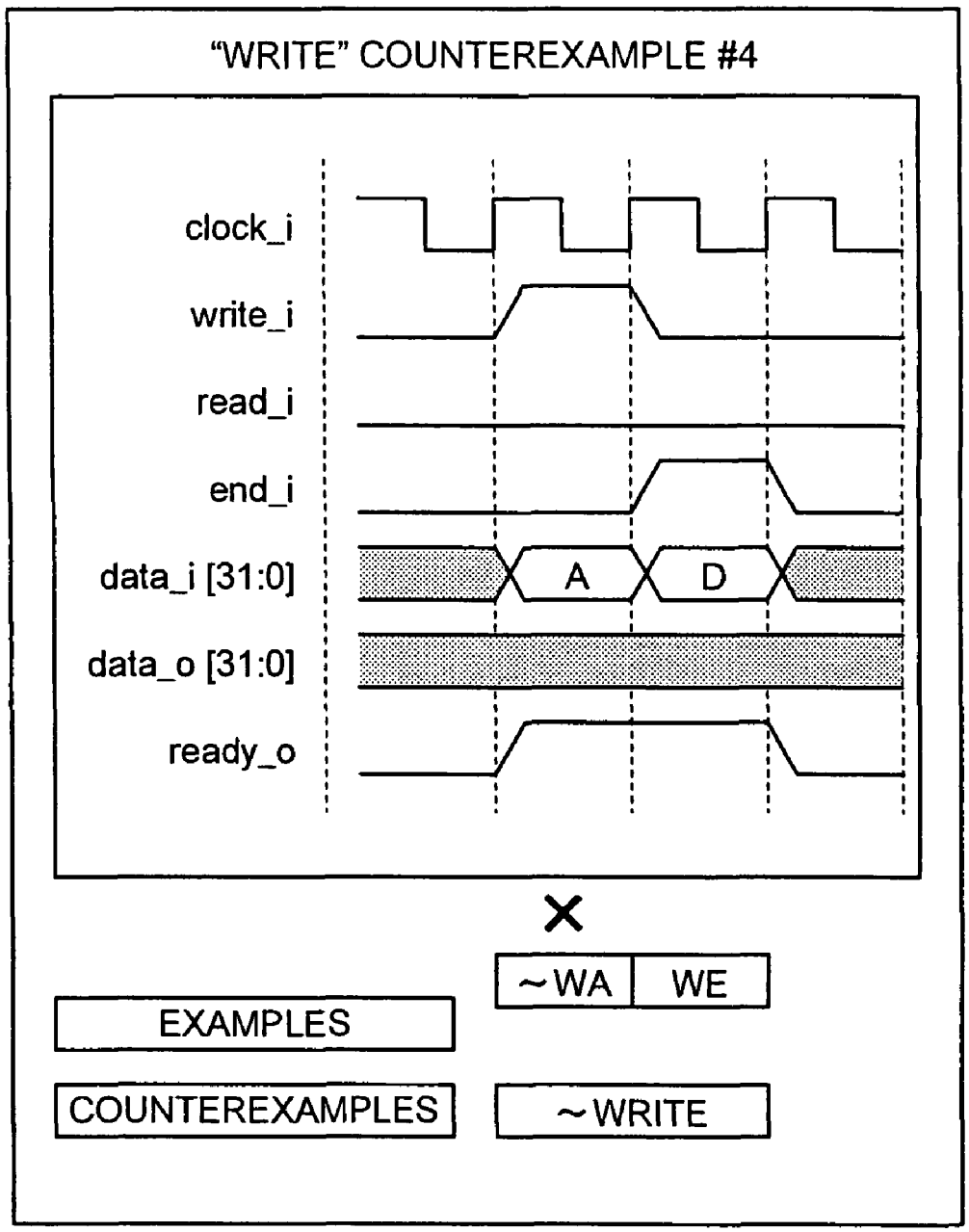
FIG. 12 is an explanatory diagram of another counterexample sequence.

In FIG. 12, the counterexample case is that the repetition number of the leading cycle of the WA is "0". Namely, although the repetition number of "0" can not be selected because the repetition number of the leading cycle of the WA is specified as "1..*", the leading cycle of the WA is repeated zero times. As a result, the "x" is indicated at the location of the WA at which the protocol definition is violated and the "~" is indicated before the designation of the WA sequence and the WRITE sequence that are not materialized because of the violation.

Figure 13:
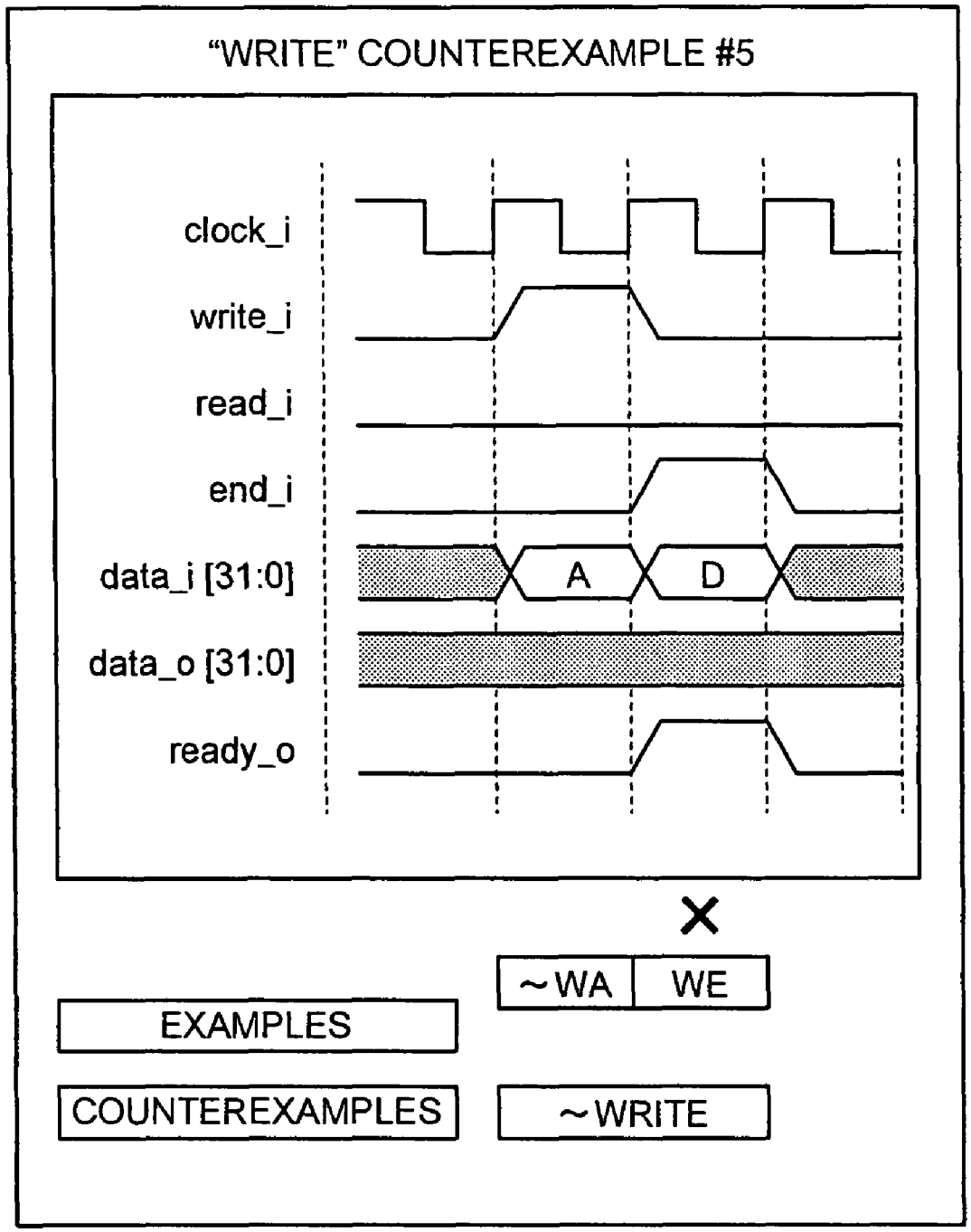
FIG. 13 is an explanatory diagram of another counterexample sequence.

In FIG. 13, the counterexample case is that the repetition number of the trailing cycle of the WA is "0". Namely, although the repetition number of "0" can not be selected because the repetition number of the trailing cycle of the WA is specified as "1", the trailing cycle of the WA is repeated zero times. As a result, the "x" is indicated at the location of the WE at which the protocol definition is violated and the "~" is indicated before the designation of the WA sequence and the WRITE sequence that are not materialized because of the violation.

In the same manner as in the case of generating the example sequence, the counterexample sequence may be generated by selecting some cases at random rather than covering all cases or by selecting only noteworthy cases based on preset conditions.

Figure 14:
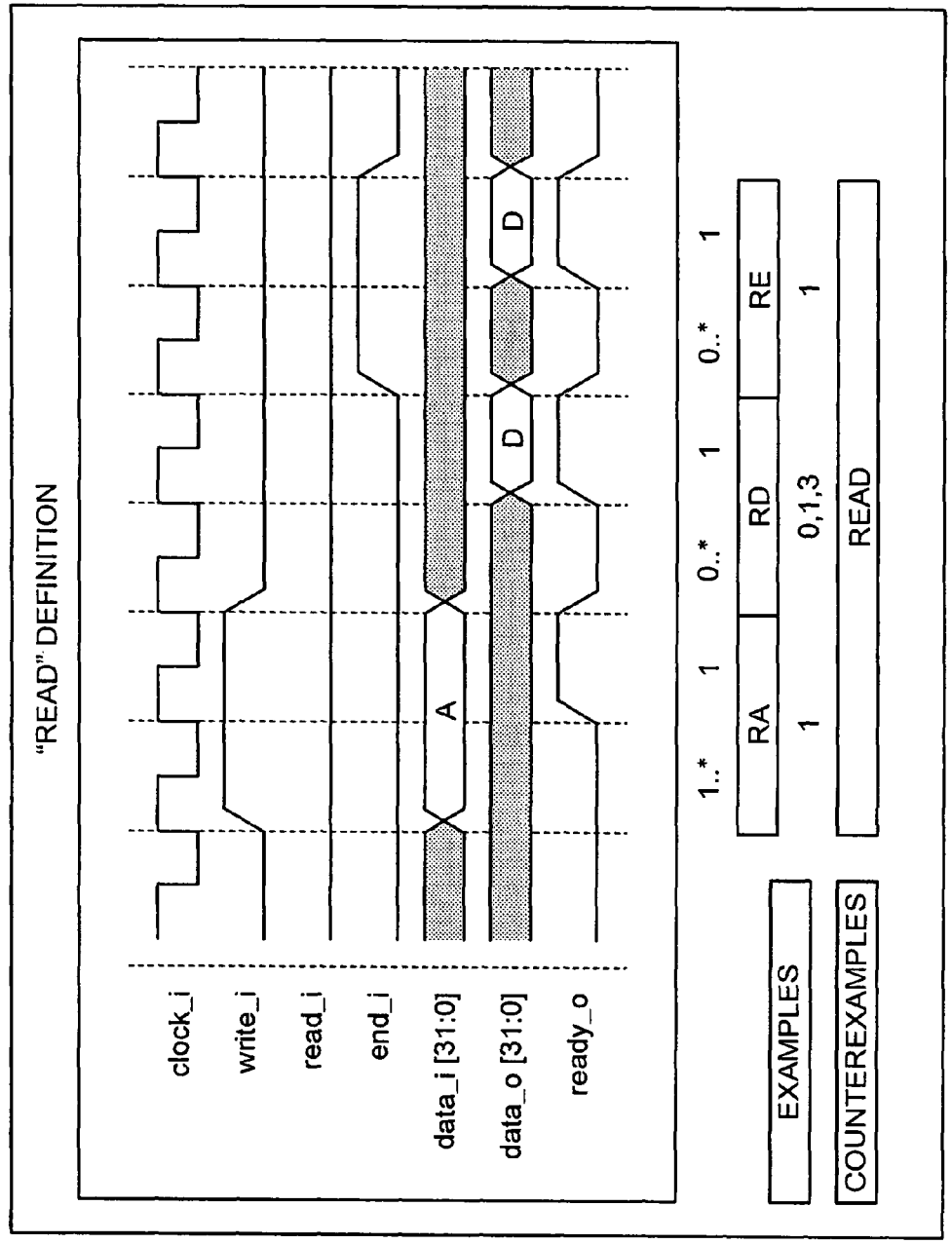
FIG. 14 is schematic illustrating an example of protocol definition corresponding to a READ sequence.

The protocol definition can be input to, for example, the READ sequence, in addition to the WRITE sequence. FIG. 14 is an explanatory diagram of an example of the protocol definition corresponding to the READ sequence.

Such protocol definition corresponding to the READ sequence as shown in FIG. 14 is input to the timing diagram editing apparatus 200, in the same manner as in the case of the protocol definition corresponding to the WRITE sequence. This enables the selection specification of the WRITE and the READ at the time of generating the example sequence and the counterexample sequence.

As seen above, by inputting all conceivable kinds of sequences (WRITE and READ sequences in this case) to the timing diagram editing apparatus 200, the protocol definition can be completed that corresponds to the hardware module as an object.

Figure 15:
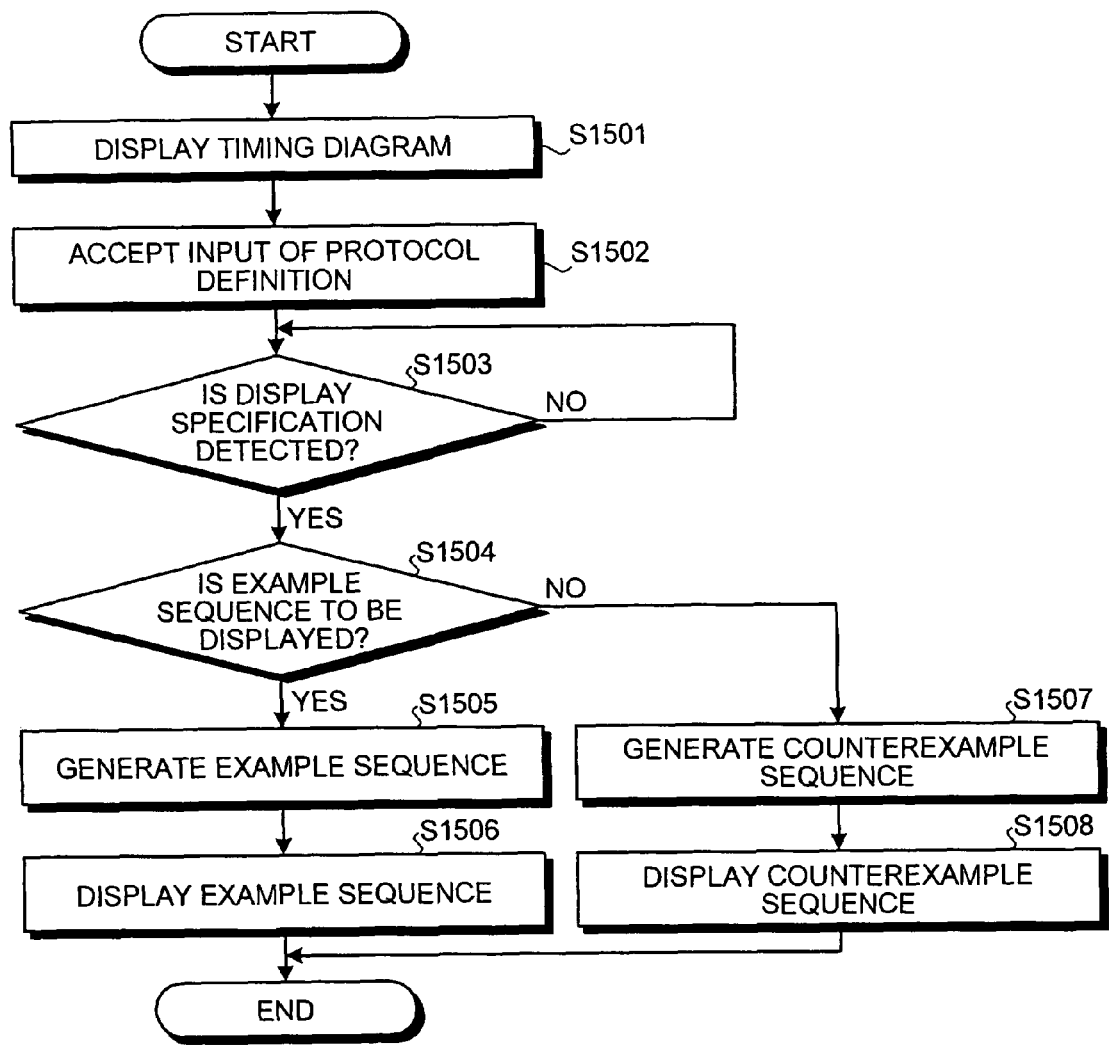
FIG. 15 is a flowchart of the timing diagram editing processing performed by the timing diagram editing apparatus.

FIG. 15 is a flowchart of the timing diagram editing processing of the timing diagram editing apparatus 200. In the flowchart of FIG. 15, the timing diagram is displayed on the display 208 of the timing diagram editing apparatus 200 (step S1501). The timing diagram to be displayed may be the timing diagram input to the timing diagram editing apparatus 200 or may be the timing diagram that the user has prepared by directly editing on the GUI.

Next, the input is accepted of the protocol definition corresponding to each sequence element shown in the timing diagram (step S1502). Specifically, the user inputs the protocol definition corresponding to each sequence element by operating the keyboard 210 or the mouse 211.

Then, judgment is made of whether the display instruction of either the example sequence or the counterexample sequence of the timing diagram is detected (step 1503). Specifically, the display instruction can be indicated by users with the examples button 505 or the counterexamples button 506 (see FIG. 5).

In wait for detection of the display instruction, if the display instruction is actually detected (step S1503: YES), then judgment is made whether it is the display instruction of the example sequence (step S1504), namely, whether the button pressed by the user at step S1503 is the examples button 505.

If the display instruction of the example sequence is the case (step S1504: YES), then the example sequence is generated according to the protocol definition input at step S1502 (step 1505). Specifically, such example sequence as shown in FIGS. 6 to 8 is generated according to the protocol definition input at step S1502.

Lastly, the generated example sequence is displayed on the display 208 (step S1506) and a sequence of processing according to this flowchart is finished. It may be so arranged that when the example sequence is displayed on the display 208, the procedure goes to step S1502 and a sequence of processing is repeated.

If, at step S1504, the display instruction is not the one of the example sequence (step S1504: NO), then the counterexample sequence is generated according to the protocol definition input at step 1502 (step S1507). Namely, judging that the button pressed by the user is the counterexamples button 506, the counterexample sequence is generated.

Lastly, the generated counterexample sequence is displayed on the display 208 (step S1508) and a sequence of processing according to this flowchart is finished. It may be so arranged that when the counterexample sequence is displayed on the display 208, the procedure goes to step S1502 and a sequence of processing is repeated.

As described above, the timing diagram editing program, the recording medium, the timing diagram editing apparatus, and the timing diagram editing method according to the embodiments of the present invention can realize the shortened work hours and reduced workload at the time of editing the timing diagram and at the same time, can improve the quality of the timing diagram.

The timing diagram editing method described in the embodiments of the present invention can be realized by executing the program prepared in advance on computers such as personal computers and workstations. This program is recorded on a computer-readable recording medium such as an HD, an FD, a CD-ROM, an MO, and a DVD and is executed by being read out from the recording medium by a computer. This program may be in the form of a transmission medium that can be distributed by way of networks such as the Internet.

According to the embodiments described above, it is possible to shorten work hours and to reduce workload at the time of editing a timing diagram, while improving the quality of the timing diagram.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein a timing diagram editing program causing a computer to execute:
   accepting numerical information representing repetition number of a waveform image appearing within an arbitrary number of clocks in a timing diagram displayed on a display screen;
   determining the repetition number of the waveform image based on the numerical information; and
   displaying a sequence image in which the waveform image is replaced with a continuous waveform image that is formed by repeating the waveform image for the determined repetition number of times so as to appear the repetition number of waveform images are connected,
   wherein the timing diagram editing program further causes the computer to execute:
   detecting a display instruction that indicates either one of an example sequence image and a counterexample sequence image of the timing diagram is to be displayed as the sequence image, wherein
   the determining includes determining the repetition number further based on the display instruction.

2. The computer-readable recording medium according to claim 1, wherein
   the determining includes determining the repetition number, when the display instruction indicates that the example sequence image is to be displayed, from among repetition numbers expressed by the numerical information, and
   the displaying includes displaying the example sequence image as the sequence image.

3. The computer-readable recording medium according to claim 1, wherein
   the determining includes determining the repetition number, when the display instruction indicates that the counterexample sequence image is to be displayed, from among repetition numbers not expressed by the numerical information, and
   the displaying includes displaying the counterexample sequence image as the sequence image.

4. The computer-readable recording medium according to claim 1, wherein the timing diagram editing program further causes the computer to execute displaying a designation of the waveform image, corresponding to the waveform image.

5. The computer-readable recording medium according to claim 4, wherein the displaying a designation includes displaying the designation in an area of which a size is changed according to the determined repetition number.

6. A timing diagram editing apparatus comprising:
   a receiving unit that receives numerical information representing repetition number of a waveform image appearing within an arbitrary number of clocks in a timing diagram displayed on a display screen;
   a determining unit that determines the repetition number of the waveform image based on the numerical information; and
   a display unit that displays a sequence image in which the waveform image is replaced with a continuous waveform image that is formed by repeating the waveform image for the determined repetition number of times so as to appear the repetition number of waveform images are connected, further comprising:
   a detecting unit that detects a display instruction that indicates either one of an example sequence image and a counterexample sequence image of the timing diagram is to be displayed as the sequence image, wherein
   the determining unit determines the repetition number further based on the display instruction.

7. The timing diagram editing apparatus according to claim 6, wherein
   the determining unit determines the repetition number, when the display instruction indicates that the example sequence image is to be displayed, from among repetition numbers expressed by the numerical information, and
   the display unit displays the example sequence image as the sequence image.

8. The timing diagram editing apparatus according to claim 7, wherein
   the determining unit determines the repetition number, when the display instruction indicates that the counterexample sequence image is to be displayed, from among repetition numbers not expressed by the numerical information, and
   the display unit displays the counterexample sequence image as the sequence image.

9. The timing diagram editing apparatus according to claim 6, further comprising a designation display unit that displays a designation of the waveform image, corresponding to the waveform image.

10. The timing diagram editing apparatus according to claim 9, wherein the designation display unit displays the designation in an area of which a size is changed according to the determined repetition number.

11. A timing diagram editing method comprising:

accepting numerical information representing repetition number of a waveform image appearing within an arbitrary number of clocks in a timing diagram displayed on a display screen;

determining the repetition number of the waveform image based on the numerical information; and displaying a sequence image in which the waveform image is replaced with a continuous waveform image that is formed by repeating the waveform image for the determined repetition number of times so as to appear the repetition number of waveform images are connected, further comprising:

detecting a display instruction that indicates either one of an example sequence image and a counterexample sequence image of the timing diagram is to be displayed as the sequence image, wherein the determining includes determining the repetition number further based on the display instruction.

12. The timing diagram editing method according to claim 11, wherein the determining includes determining the repetition number, when the display instruction indicates that the example sequence image is to be displayed, from among repetition numbers expressed by the numerical information, and the displaying includes displaying the example sequence image as the sequence image.

13. The timing diagram editing method according to claim 11, wherein the determining includes determining the repetition number, when the display instruction indicates that the counterexample sequence image is to be displayed, from among repetition numbers not expressed by the numerical information, and the displaying includes displaying the counterexample sequence image as the sequence image.

14. The timing diagram editing method according to claim 11, further comprising displaying a designation of the waveform image, corresponding to the waveform image.

15. The timing diagram editing method according to claim 14, wherein the displaying a designation includes displaying the designation in an area of which a size is changed according to the determined repetition number.

16. A computer-readable recording medium that stores therein a timing diagram editing program causing a computer to execute:

accepting numerical information representing repetition numbers of a first waveform image and a second waveform image in a timing diagram displayed on a display screen, wherein the second waveform image is a part of the first waveform image;

determining repetition numbers of the first waveform image and the second waveform image based on the numerical information; and displaying a first sequence image and a second sequence image in which the first waveform image and the second waveform image are replaced with a continuous waveform image that is formed by repeating the first waveform image and the second waveform image for the determined repetition numbers of times, respectively.

* * * * *

UNITED STATES PATENT AND TRADEMARK OFFICE
CERTIFICATE OF CORRECTION

| | |
|---|---|
| PATENT NO. | : 7,911,466 B2 |
| APPLICATION NO. | : 11/706221 |
| DATED | : March 22, 2011 |
| INVENTOR(S) | : Hiroaki Iwashita |

It is certified that error appears in the above-identified patent and that said Letters Patent is hereby corrected as shown below:

First Page, Column 2 (Other Publications), Line 2, Delete "Langugage" and insert --Language--, therefor.

Column 12, Line 50-51, In Claim 8, Delete "claim 7," and insert --claim 6,--, therefor.

Signed and Sealed this
Fifth Day of July, 2011

David J. Kappos
*Director of the United States Patent and Trademark Office*